(12) United States Patent
Masuda

(10) Patent No.: US 11,270,863 B2
(45) Date of Patent: Mar. 8, 2022

(54) MICROWAVE AMPLIFICATION DEVICE INCLUDING A MICROWAVE ELECTRON TUBE HAVING A GETTER THAT CAN BE CONTROLLED

(71) Applicant: NEC NETWORK AND SENSOR SYSTEMS, LTD., Fuchu (JP)

(72) Inventor: Taishi Masuda, Tokyo (JP)

(73) Assignee: NEC Network and Sensor Systems, Ltd., Tokyo (JP)

( * ) Notice: Subject to any disclaimer, the term of this patent is extended or adjusted under 35 U.S.C. 154(b) by 0 days.

(21) Appl. No.: 16/487,354

(22) PCT Filed: Feb. 16, 2018

(86) PCT No.: PCT/JP2018/005495
§ 371 (c)(1),
(2) Date: Aug. 20, 2019

(87) PCT Pub. No.: WO2018/151253
PCT Pub. Date: Aug. 23, 2018

(65) Prior Publication Data
US 2020/0058460 A1 Feb. 20, 2020

(30) Foreign Application Priority Data

Feb. 20, 2017 (JP) .............................. JP2017-029286

(51) Int. Cl.
| H01J 7/18 | (2006.01) |
| H01J 23/26 | (2006.01) |
| H01J 23/027 | (2006.01) |
| H01J 23/087 | (2006.01) |
| H01J 25/34 | (2006.01) |
| H03F 3/58 | (2006.01) |
| H01J 23/12 | (2006.01) |

(52) U.S. Cl.
CPC .............. *H01J 7/18* (2013.01); *H01J 23/027* (2013.01); *H01J 23/087* (2013.01); *H01J 23/12* (2013.01);

(Continued)

(58) Field of Classification Search
CPC .... H01J 7/18; H01J 23/12; H01J 23/26; H01J 25/02; H01J 25/34
(Continued)

(56) References Cited

U.S. PATENT DOCUMENTS 2,410,063 A 10/1946 Hansen et al.
2,749,466 A 6/1956 Agule
(Continued)

FOREIGN PATENT DOCUMENTS

JP 53-85960 A 7/1978
JP 58-88762 U 6/1983
(Continued)

OTHER PUBLICATIONS

International Search Report for PCT/JP2018/005495 dated Apr. 17, 2018 [PCT/ISA/210].
(Continued)

*Primary Examiner* — Benny T Lee
(74) *Attorney, Agent, or Firm* — Sughrue Mion, PLLC

(57) ABSTRACT

The objective of the invention is to provide a microwave tube, or the like, wherein gas adsorption action of a getter may be satisfactorily performed independently from a microwave amplification operation. In order to solve this problem, this microwave electron tube comprises: a helix wherein a microwave may progress oriented from an input section to an output section within a helical tube; an electron gun emitting an electron flow oriented toward the helix; a focusing device causing the electron flow to traverse the vicinity of the helix in the direction of a collector; the collector absorbing the electron flow; and a getter having a heater insulated from the cathode provided in the electron gun.

13 Claims, 10 Drawing Sheets

(52) U.S. Cl.
CPC .............. *H01J 23/26* (2013.01); *H01J 25/34* (2013.01); *H03F 3/58* (2013.01)

(58) Field of Classification Search
USPC .......................................... 315/3.5
See application file for complete search history.

(56) References Cited

U.S. PATENT DOCUMENTS

| | | | |
|---|---|---|---|
| 2,984,762 A | 5/1961 | Haas | |
| 3,073,987 A * | 1/1963 | Harper et al. .......... | H01J 23/02 315/3.6 |
| 2011/0266951 A1* | 11/2011 | Andre ..................... | H01J 23/34 315/5.13 |

FOREIGN PATENT DOCUMENTS

| | | |
|---|---|---|
| JP | 62-24466 U | 2/1987 |
| JP | 62-133641 A | 6/1987 |
| JP | 1-154434 A | 6/1989 |
| JP | 4-63541 U | 5/1992 |
| JP | 10-199453 A | 7/1998 |
| JP | 2000-294156 A | 10/2000 |
| JP | 2002-25454 A | 1/2002 |

OTHER PUBLICATIONS

Extended European Search Report for EP Application No. EP18754726.0 dated Apr. 15, 2021.

* cited by examiner

MICROWAVE AMPLIFICATION DEVICE INCLUDING A MICROWAVE ELECTRON TUBE HAVING A GETTER THAT CAN BE CONTROLLED

CROSS REFERENCE TO RELATED APPLICATIONS

This application is a National Stage of International Application No. PCT/JP2018/005495, filed on Feb. 16, 2018, which claims priority from Japanese Patent Application No. 2017-029286, filed on Feb. 20, 2017, the contents of all of which are incorporated herein by reference in their entirety.

TECHNICAL FIELD

The present invention relates to a device for amplifying a microwave signal.

BACKGROUND ART

A microwave signal electron tube (to be also referred to as a "microwave tube" hereinafter) is a device for amplifying an input microwave signal (see PTL 1).

PTL 1 discloses a microwave tube including an electron gun portion, a high-frequency circuit portion, a collector portion, and a focusing device. The electron gun portion includes a first heater and a second heater. The first heater is located adjacent to a cathode, of the electron gun portion, for generating the electron beam and is used to heat the cathode. The second heater is used for gas adsorption and includes a second heater for heating having one end connected to the cathode, and the other end connected to an external lead wire of the cathode.

CITATION LIST

Patent Literature

[PTL 1] Japanese Unexamined Patent Application Publication No. 2002-25454 A

SUMMARY OF THE INVENTION

Technical Problem

The second heater provided in a getter of the microwave tube disclosed in PTL 1 has one end connected to the cathode, and the other end connected to an external lead wire of the cathode, as mentioned above. With this arrangement, applying a voltage to the cathode varies power supplied to the second heater. It is, therefore, difficult for the microwave tube disclosed in PTL 1 to supply power optimum for gas adsorption action of the getter to the second heater in both microwave signal amplification operation ON and OFF states.

An object of the present invention is to provide a microwave tube and the like that can satisfactorily perform gas adsorption action of a getter independently of a microwave signal amplification operation.

Solution to the Problem

A microwave signal electron tube of the present invention includes: a helix configured to guide a microwave signal to travel from an input section to an output section through a helical tube; an electron gun emitting an electron flow toward the helix; a focusing device causing the electron flow to traverse a vicinity of the helix in a direction to a collector; the collector absorbing the electron flow; and a getter including a heater insulated from a cathode provided in the electron gun.

Advantageous Effects of the Invention

The microwave tube and the like according to the present invention can satisfactorily perform gas adsorption action of a getter independently of a microwave signal amplification operation.

EXAMPLE EMBODIMENT

Figure 1:
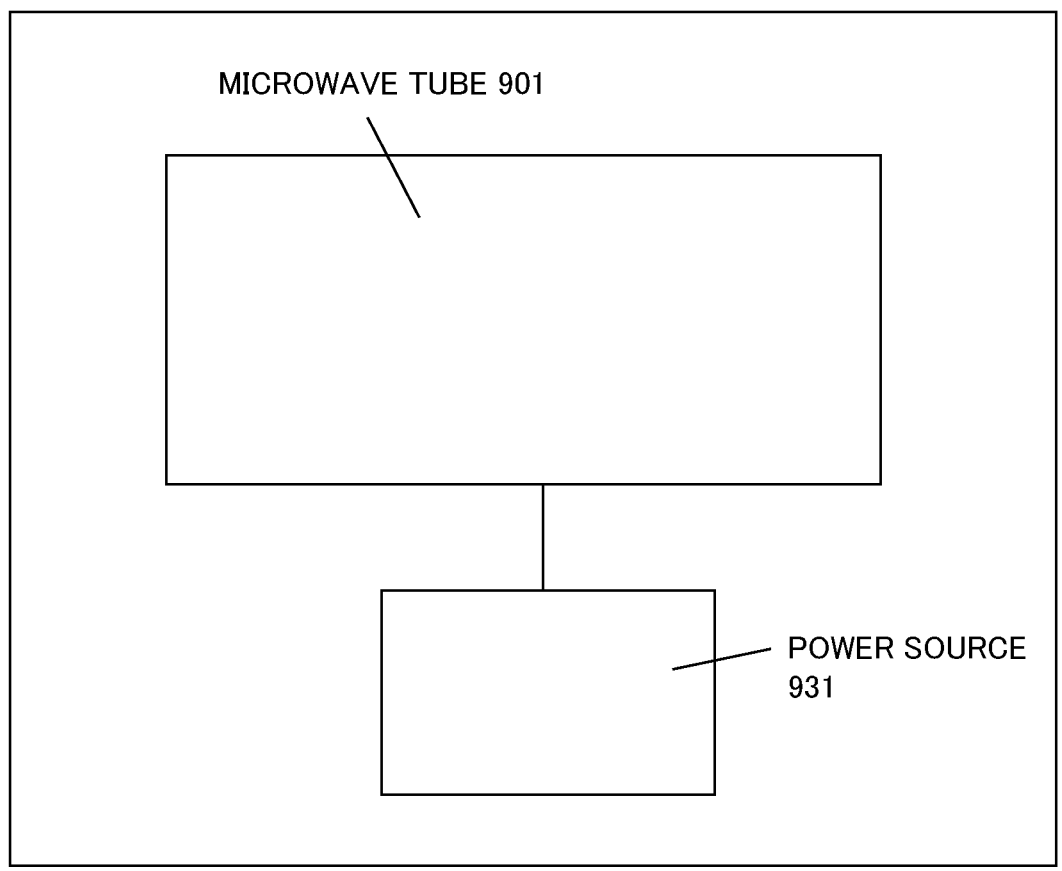
FIG. 1 is a conceptual diagram illustrating the configuration of a microwave signal amplification device according to the present example embodiment.

FIG. 1 is a block diagram illustrating the configuration of a microwave signal amplification device 100 as an exemplary microwave signal amplification device according to the present example embodiment.

The microwave signal amplification device 100 includes a microwave tube 901 and a power source 931.

The microwave tube 901 amplifies an input microwave signal.

The power source 931 supplies power to each component constituting the microwave tube 901.

Figure 2:
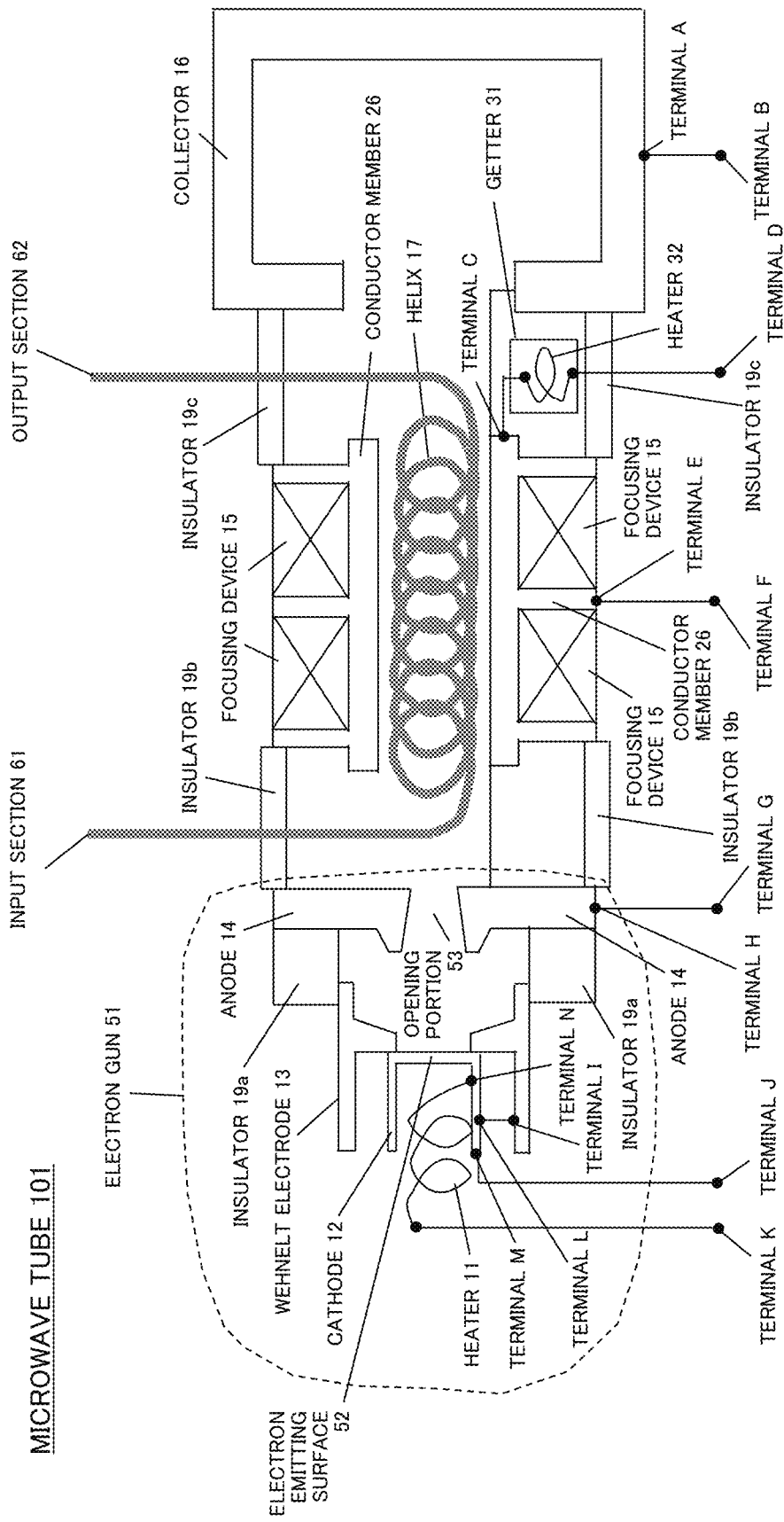
FIG. 2 is a conceptual view illustrating an exemplary longitudinal cross-section of a microwave tube according to the present example embodiment.

FIG. 2 is a conceptual view illustrating the structure of a microwave tube 101 as an example of the microwave tube 901 illustrated in FIG. 1. FIG. 2 illustrates a longitudinal cross-section of the microwave tube 101. The microwave tube 101 is implemented as a helix traveling-wave tube. For details of the helix traveling-wave tube, see, for example, PTL 1.

The microwave tube 101 includes an electron gun 51, a helix 17, a focusing device 15, a collector 16, a getter 31, a conductor member 26, and insulators 19b and 19c.

The electron gun 51 is a portion emitting electrons toward the helix 17.

The electron gun 51 includes a heater 11, a cathode 12, a Wehnelt electrode 13, an anode 14, and an insulator 19a. The cathode 12, the Wehnelt electrode 13, the insulator 19a, and the anode 14 are arranged coaxially.

The heater 11 heats the cathode 12 by providing power applied across terminals K and J. The heating temperature at which the heater 11 heats the cathode 12 is, for example, 1,000 degrees C.

The cathode 12 emits electrons from an electron emitting surface 52 of the cathode 12 toward the anode 14 by heating of the heater 11 and a voltage applied across terminals J and G. The terminal J, connected to terminal M connected to terminals L and N, is assumed to be connected to one terminal of each of a heater power source 39, an anode power source 30, a helix power source 34, and a collector power source 33 (to be described later with reference to FIG. 4). The terminal K is assumed to be connected to the other terminal of the heater power source 39 (to be described later with reference to FIG. 4).

The Wehnelt electrode 13 has a nearly cylindrical shape, and focuses the electrons emitted from the electron emitting surface 52 of the cathode 12 so that the electrons traverse an opening portion 53 of the anode 14 and travel toward the helix 17. Terminal I of the Wehnelt electrode 13 is connected to the terminal L connected to the terminal N of the heater 11.

The insulator 19a has, for example, a cylindrical shape. The insulator 19a insulates the cathode 12 and the Wehnelt electrode 13 from the anode 14. The insulator 19a seals the "inner space of the electron gun 51," and the periphery of the helix 17, the "inner space of the collector 16," the periphery of the getter 31, and the like, connected to the interior of the electron gun 51 via the opening portion 53, to maintain a vacuum. The "inner space of the electron gun 51" means herein a space covered with the components constituting the electron gun 51, except for the opening portion 53. The "inner space of the collector 16" means a space covered with the components constituting the collector 16, except for the opening portion of the collector 16.

The inner space of the electron gun 51, the periphery of the helix 17, the inner space of the collector 16, the periphery of the getter 31, and the like will be referred to as a "helix periphery and the like" hereinafter.

The insulator 19a is made of, for example, ceramics.

The electrons emitted from the opening portion 53 of the electron gun 51 travel from the opening portion 53 toward the helix 17 and the collector 16 by, for example, a voltage applied across terminals J and B. Note that the terminal G is connected to terminal H of anode 14 and is assumed to be connected to the other terminal of the anode power source 30 (to be described later with reference to FIG. 4).

The focusing device 15 is implemented as, for example, a cylindrical magnet located concentrically with the electron gun 51. An example of the magnet is a permanent magnet. The focusing device 15 illustrated in FIG. 2 is formed by two cylindrical magnets. Note that the number of magnets forming the focusing device 15 is not limited to two, and is arbitrary.

The focusing device 15 uses a generated magnetic field to control the traveling direction of the electrons, emitted from the electron gun 51, to cause these electrons to travel toward the collector 16 through a space in the vicinity of the spiral part of helix 17.

The helix 17 is formed by spirally shaping a hollow, tubular elongated conductor. A microwave signal is input into the hollow tube from an input section 61 of the helix 17. The input microwave signal travels toward an output section 62 along the spiral shape of the helix 17 through the tube of the helix 17. In traveling through the tube of the helix 17, the microwave signal interacts with the electrons emitted from the electron gun 51 and traversing the space in the vicinity of the helix 17. The microwave signal is amplified by the interaction. The amplified microwave signal is output from the output section 62.

The collector 16 absorbs the electrons travelling toward the collector 16 and colliding with the collector 16. The energy of the colliding electrons is converted into heat. The converted heat is expelled out of the surface of the collector 16. A terminal A of the collector 16 is connected to the terminal B. The terminal B is assumed to be connected to the other terminal of the collector power source 33 (to be described later with reference to FIG. 4).

The insulator 19b has a cylindrical shape, and insulates the anode 14 from the conductor member 26. The insulator 19b seals the helix periphery and the like, together with other members, in a vacuum. The insulator 19b is made of, for example, ceramics.

The conductor member 26 covers the periphery of the helix 17. The conductor member 26 seals the helix periphery and the like, together with other members, in a vacuum.

A terminal E of the conductor member 26 is connected to a terminal F. The terminal F is assumed to be connected to the ground.

The insulator 19c has, for example, a cylindrical shape, and insulates the collector 16 from the conductor member 26. The insulator 19c seals the helix periphery and the like, together with other members, in a vacuum. The insulator 19c is made of, for example, ceramics.

The getter 31 is implemented as a nonevaporable getter. For details of the nonevaporable getter, see, for example, PTL 1.

The getter 31 includes a heater 32.

The upper end of the heater 32 is connected to a terminal C of the conductor member 26. As described earlier, since the conductor member 26 is connected to the ground, the upper end of the heater 32 is also connected to the ground. The lower end of the heater 32 is connected to a terminal D. The terminal D is assumed to be connected to the terminal, which is not connected to the ground, of a getter power source 35 (to be described later with reference to FIG. 4).

The heater 32 heats a getter material, formed on a getter surface, by power applied across the terminals D and F. The heating temperature at which the heater 32 heats the getter material is, for example, several hundred degrees C.

The getter material exhibits a gas molecule adsorption capability that increases with a rise in temperature by heating of the heater 32. The getter material adsorbs a gas remaining in the vacuum of the periphery of the getter 31, resulting in an improvement in degree of vacuum of the periphery of the getter 31. This improvement, in turn, improves the degree of vacuum of the interior defined by the helix periphery and the like.

As the getter material, a known porous body containing zirconium as a main ingredient and added with vanadium, iron, or the like can be used.

The getter 31 may use a getter material directly or indirectly formed on the surface of the heating portion of the heater 32.

The getter 31 may be disposed in a box-shaped getter chamber having a periphery surrounded by partitions. However, the getter chamber does not completely shield the getter 31 from spaces on the helix periphery and the like. The getter chamber prevents the getter 31 from coming into contact with other conductive members, applied with a predetermined potential, such as the collector 16.

Figure 3:
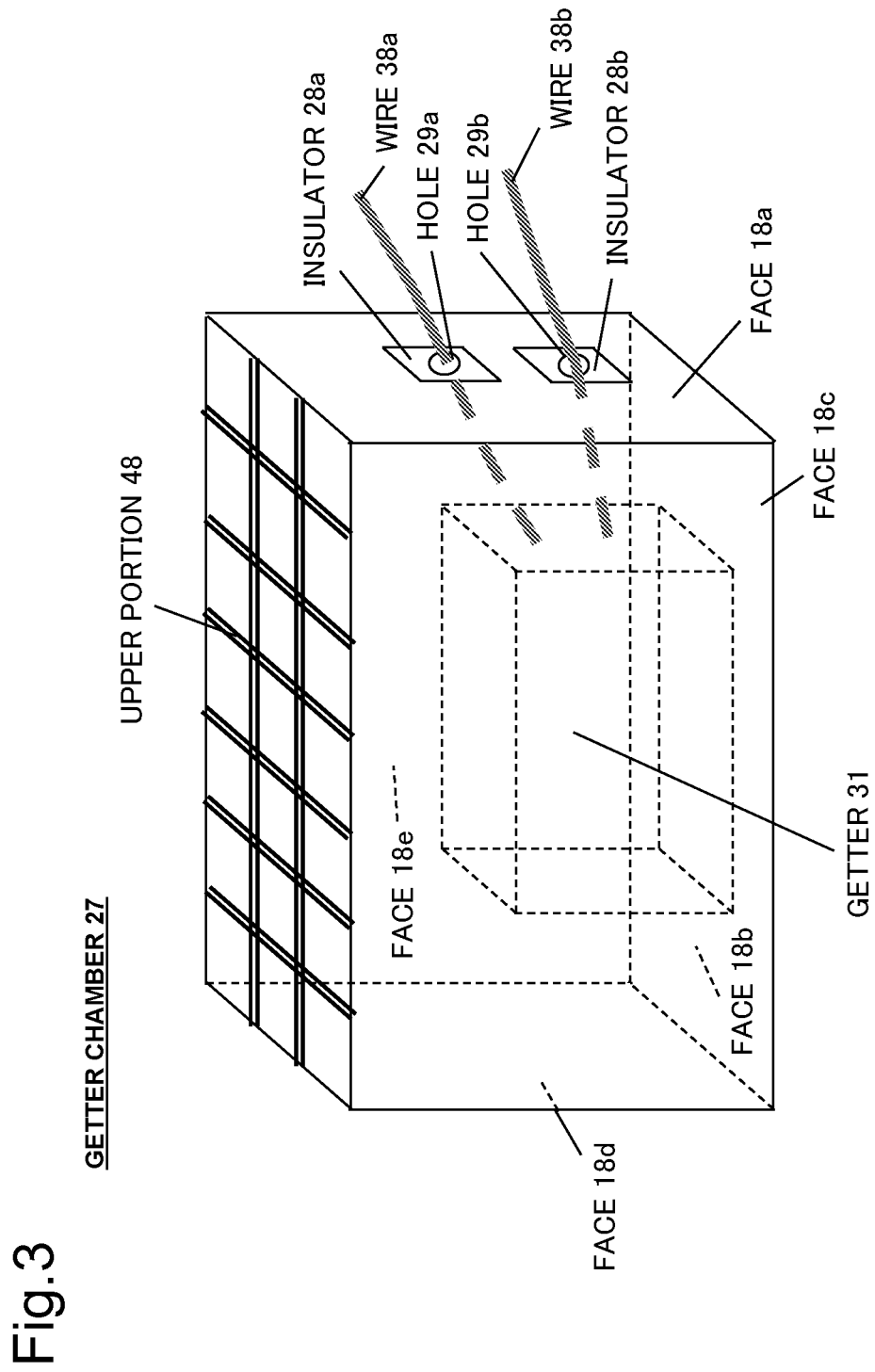
FIG. 3 is a perspective view illustrating an exemplary arrangement of a getter chamber.

FIG. 3 is a perspective view illustrating the arrangement of a getter chamber 27 as an example of the above-mentioned getter room. FIG. 3 also illustrates the getter 31.

The getter chamber 27 has, for example, a shape similar to a rectangular parallelepiped.

The getter chamber 27 includes faces 18a, 18b, 18c, 18d and 18e, and an upper portion 48.

The faces 18a, 18b, 18c, 18d and 18e are formed by, for example, metal plates.

The upper portion 48 has a grid pattern, as illustrated in FIG. 3. The portion of the grid pattern is formed by, for example, metal wires. The inner space of the getter chamber 27 connects to the outer space of the getter chamber 27 through the openings of the grids.

The getter 31 is fixed onto the face 18b.

The face 18a is formed by fitting insulators 28a and 28b into a plate made of, for example, a metal. A hole 29a is formed in the insulator 28a, and a hole 29b is formed in the insulator 28b.

A heater (not illustrated) in the getter 31 includes wires 38a and 38b electrically connected to each other in the getter 31. The wire 38a connects to the exterior of the getter chamber through the hole 29a, and the wire 38b connects to this exterior through the hole 29b.

Figure 4:
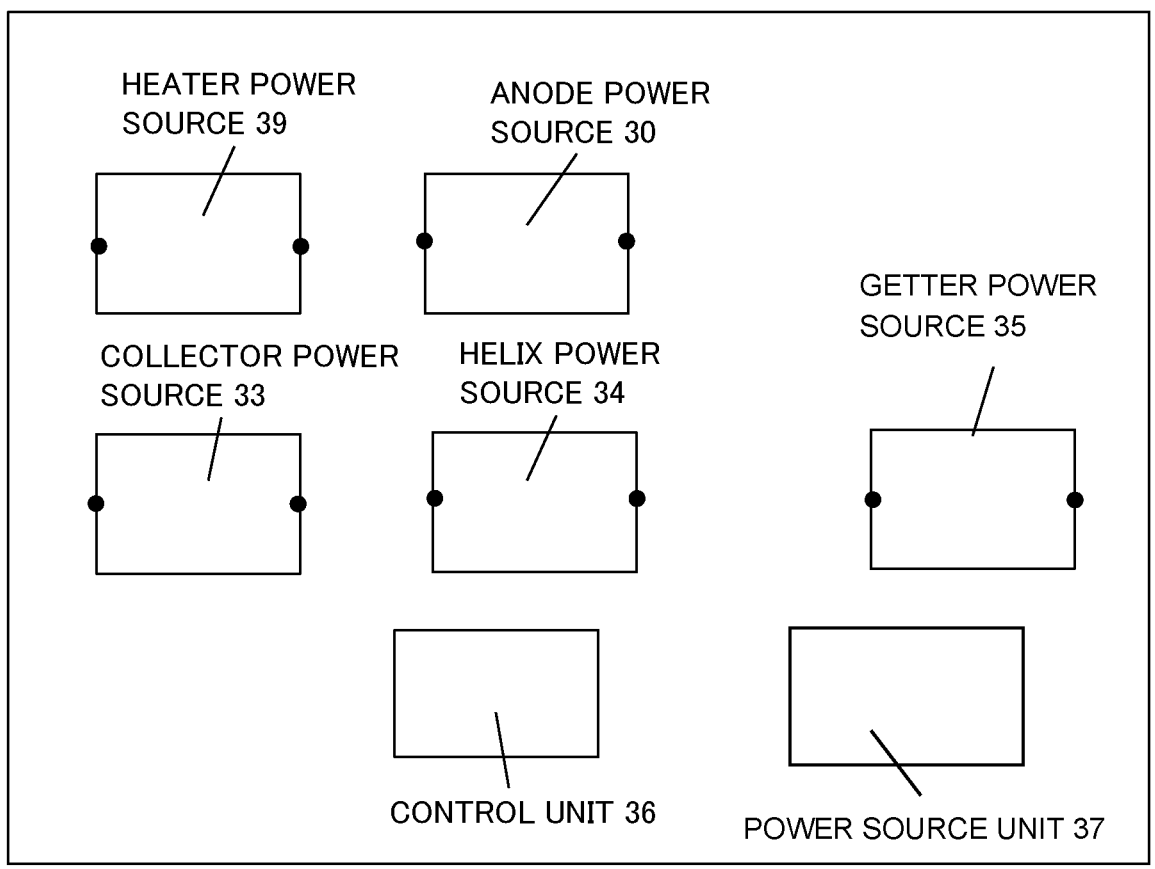
FIG. 4 is a diagram illustrating an exemplary configuration of a power source.

FIG. 4 is a diagram illustrating the configuration of a power source 131 as an example of the power source 931 illustrated in FIG. 1.

The power source 131 includes a heater power source 39, an anode power source 30, a collector power source 33, a helix power source 34, a getter power source 35, and a control unit 36. Small black circles illustrated in FIG. 4 represent the terminals of the respective power sources. The above-mentioned respective power sources are externally supplied with power via power lines (not illustrated).

One terminal of the getter power source 35 is assumed to be connected to the terminal D illustrated in FIG. 2. The other terminal of the getter power source 35 is assumed to be connected to the ground (not illustrated).

The control unit 36 is connected to each of the heater power source 39, the anode power source 30, the collector power source 33, the helix power source 34, and the getter power source 35 via a corresponding signal line (not illustrated). The control unit 36 controls the operation of each of these power sources by sending a control signal to the corresponding one of these power sources via the signal line. This control signal includes ON/OFF control of power supplied across the two terminals of the getter power source 35, which is performed by the getter power source 35 at a predetermined timing.

The getter power source 35 turns on and off power supplied across the two terminals of the getter power source 35, in response to an instruction from the control unit 36. The value of the supplied power is set to, for example, a power value corresponding to the temperature, at which the getter 31 acts effectively, by measuring a temperature of the getter 31 and measuring a relationship between the temperature and the supplied power. A temperature sensor (not illustrated) may be provided in the getter 31 (FIG. 3) and measure the temperature in accordance with the output of the temperature sensor.

An example of the above-mentioned timing at which the getter power source 35 turns on and off power supplied across the two terminals of the getter power source 35 is a given time interval.

Another example of the above-mentioned timing is a timing associated with the start of a microwave signal amplification operation by the microwave tube 101 illustrated in FIG. 2. Upon the amplification operation, the degree of vacuum of the helix periphery and the like is expected to degrade. Therefore, the control unit 36, for example, turns on power supplied across these two terminals, simultaneously with the start of the amplification operation or shortly before this start. The control unit 36 turns off the power supplied across these two terminals, at the end of the amplification operation or after this end.

Still another example of the above-mentioned timing is a timing interlocked with a value representing the degree of vacuum.

An example of the value representing the degree of vacuum is a value output from a vacuum gauge (not illustrated in FIG. 2) provided on any of the helix periphery and the like. The control unit 36 turns on the power when, for example, the output value exceeds a predetermined threshold indicating that the degree of vacuum is low. The control unit 36 turns off the power when, for example, the output value falls below the threshold.

The value representing the degree of vacuum may, alternatively, be a helix current value sent from the helix power source 34 to the control unit 36 via a signal path (not illustrated in FIG. 4). The "helix current value" means herein the value of a current generated between the ground (not illustrated) and the helix illustrated in FIG. 2 or a conductive portion electrically connected to the helix 17. The value of a current generated between the above-mentioned ground and a conductive support portion (not illustrated) supporting the helix 17, for example, is used as the helix current value.

It is understood empirically or the like that an increase in helix current value amounts to a decrease in degree of vacuum. This may be for the following reason. A decrease in degree of vacuum in the microwave tube, that is, an increase in number of gas molecules in the tube raises the probability that electrons and the gas molecules will collide with each other. The collision between the electrons and the gas molecules disturbs the traveling direction of an electron flow, and the probability that the electron flow will collide with the helix 17 or the conductive portion, therefore, rises. When this occurs, the helix current increases with a decrease in degree of vacuum.

The control unit 36 turns on power supplied across the two getter power source 35 terminals when, for example, the helix current value exceeds a certain threshold. The control unit 36 turns off the power when, for example, the helix current value falls below the threshold.

ON/OFF of the power by the control unit 36, as described above, can be implemented by an arrangement that may allow one terminal of the heater 32 illustrated in FIG. 2 to be connected to the ground, and supply power to the heater 32 by the getter power source 35, illustrated in FIG. 4, independent of other power sources.

The getter power source according to this example embodiment may even be implemented assuming the absence of the control unit 36.

One terminal of the heater power source 39 illustrated in FIG. 4 is assumed to be connected to the terminal K illustrated in FIG. 2. The other terminal of the heater power source 39 is assumed to be connected to the terminal J illustrated in FIG. 2.

One terminal of the anode power source 30 is assumed to be connected to the terminal J illustrated in FIG. 2. The other terminal of the anode power source 30 is assumed to be connected to the terminal G illustrated in FIG. 2.

One terminal of the collector power source 33 is assumed to be connected to the terminal J illustrated in FIG. 2. The other terminal of the collector power source 33 is assumed to be connected to the terminal B illustrated in FIG. 2.

One terminal of the getter power source 35 is assumed to be connected to the terminal D illustrated in FIG. 2. The other terminal of the getter power source 35 is assumed to be connected to the ground (not illustrated).

One terminal of the helix power source 34 is assumed to be connected to the terminal J illustrated in FIG. 2. The other terminal of the helix power source 34 is assumed to be connected to the above-mentioned ground.

The microwave tube 101 illustrated in FIG. 2 includes the getter 31 between the focusing device 15 and the collector 16. However, the position of the getter provided in the microwave tube according to this example embodiment is arbitrary, as long as a microwave signal amplification operation by the microwave tube 101 is not hindered, and one terminal of the heater provided in the getter can be connected to the ground.

Figure 5:
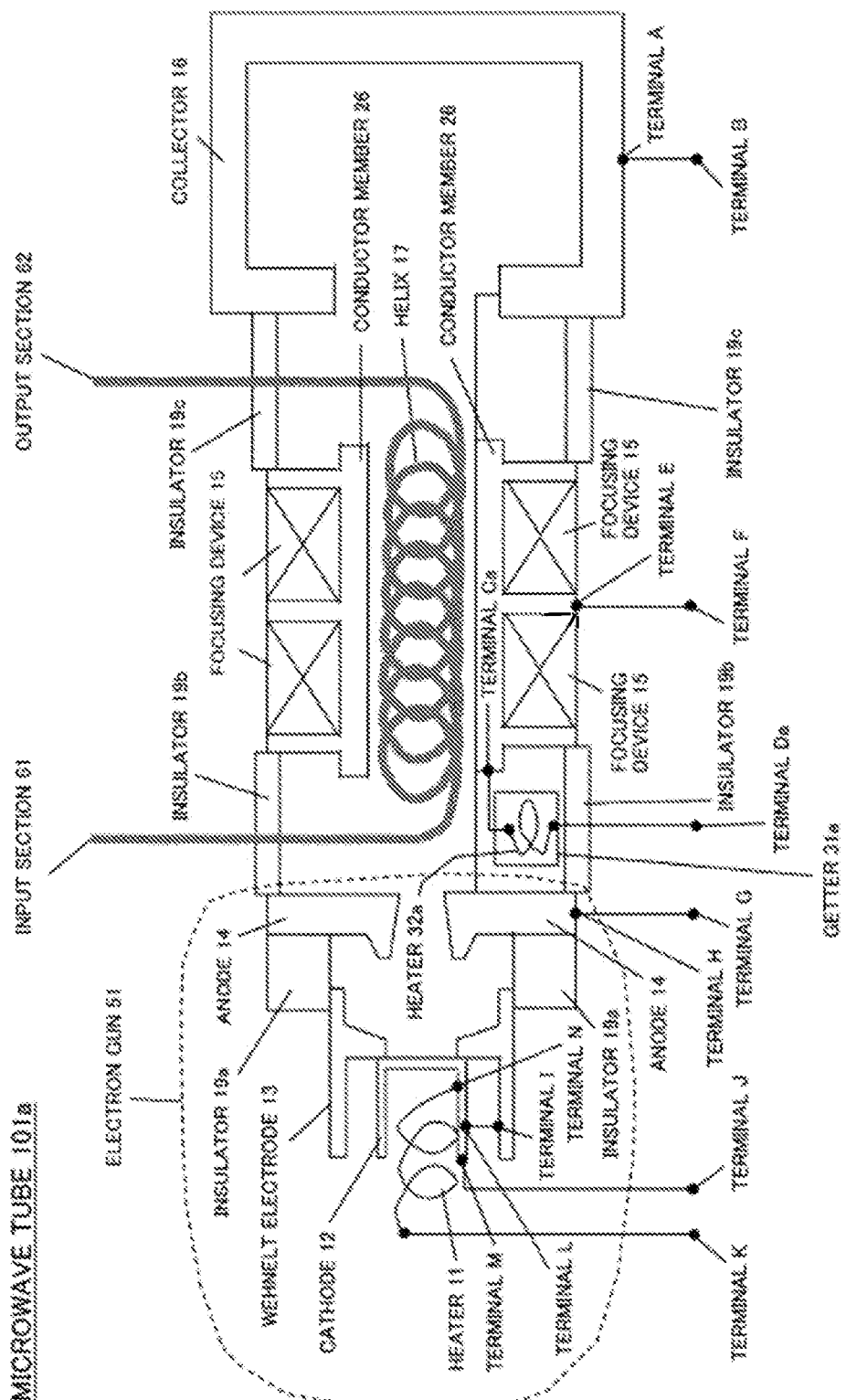
FIG. 5 is a conceptual view illustrating an exemplary structure of the microwave tube according to the present example embodiment, with a getter being interposed between an anode and a focusing device.

FIG. 5 is a conceptual view illustrating the structure of a microwave tube 101a as an example of the microwave tube according to this example embodiment, with the getter being interposed between the anode and the focusing device. FIG. 5 illustrates a longitudinal cross-section of the microwave tube 101a.

A getter 31a is formed not between the collector 16 and the focusing device 15, but between the anode 14 and the focusing device 15.

A description of the microwave tube 101a is the same as that of the microwave tube 101 illustrated in FIG. 2, except in the above-mentioned respect. In this description, however, the getter 31 (FIG. 2) is changed to the getter 31a, the heater 32 (FIG. 2) is changed to a heater 32a, the terminal D (FIG. 2) is changed to a terminal Da, and the terminal C (FIG. 2) is changed to a terminal Ca.

A plurality of getters may be provided in the microwave tube according to this example embodiment and disposed at different positions.

Figure 6:
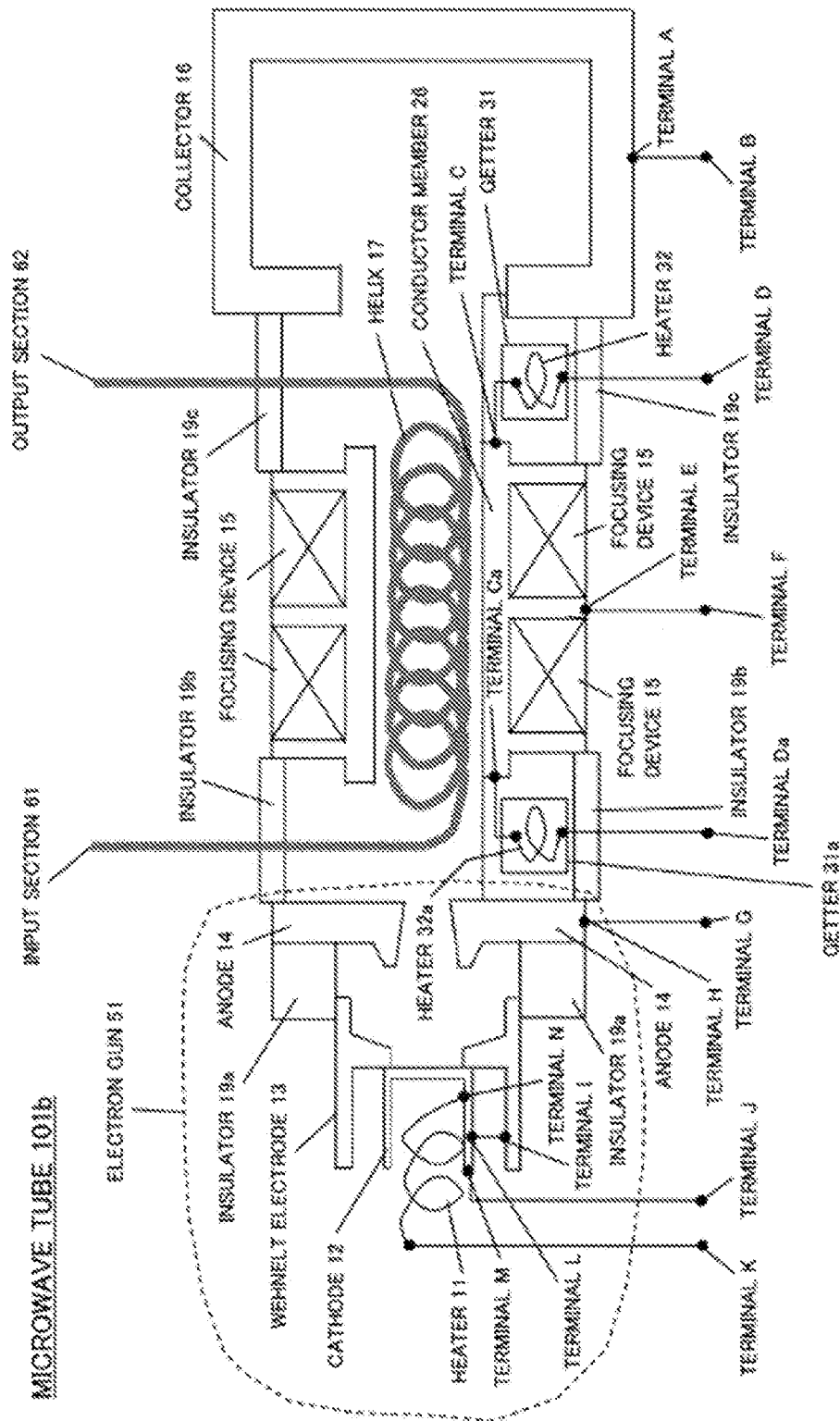
FIG. 6 is a conceptual view illustrating an exemplary structure of the microwave tube according to the present example embodiment, with getters being disposed at two positions.

FIG. 6 is a conceptual view illustrating the structure of a microwave tube 101b as an example of the microwave tube according to this example embodiment, with getters being disposed at two positions. FIG. 6 illustrates a longitudinal cross-section of the microwave tube 101b.

The microwave tube 101b includes two getters: the getters 31 and 31a. The microwave tube 101b includes two getters in this manner, and the degree of vacuum of the helix periphery and the like can thus further be improved.

A description of the microwave tube 101b is the same as that of the microwave tube 101 illustrated in FIG. 2, except in the above-mentioned respect, with regard to the getter 31. A description of the microwave tube 101b is also the same as that of the microwave tube 101a illustrated in FIG. 5, except in the above-mentioned respect, with regard to the getter 31a.

A description of the microwave tube 101b is the same as that of the microwave tube 101 illustrated in FIG. 2, except in the above-mentioned respect. In this description, however, the getter 31, the heater 32, and the terminals D and C are changed as appropriate, where necessary.

[Process Sequence]

Figure 7:
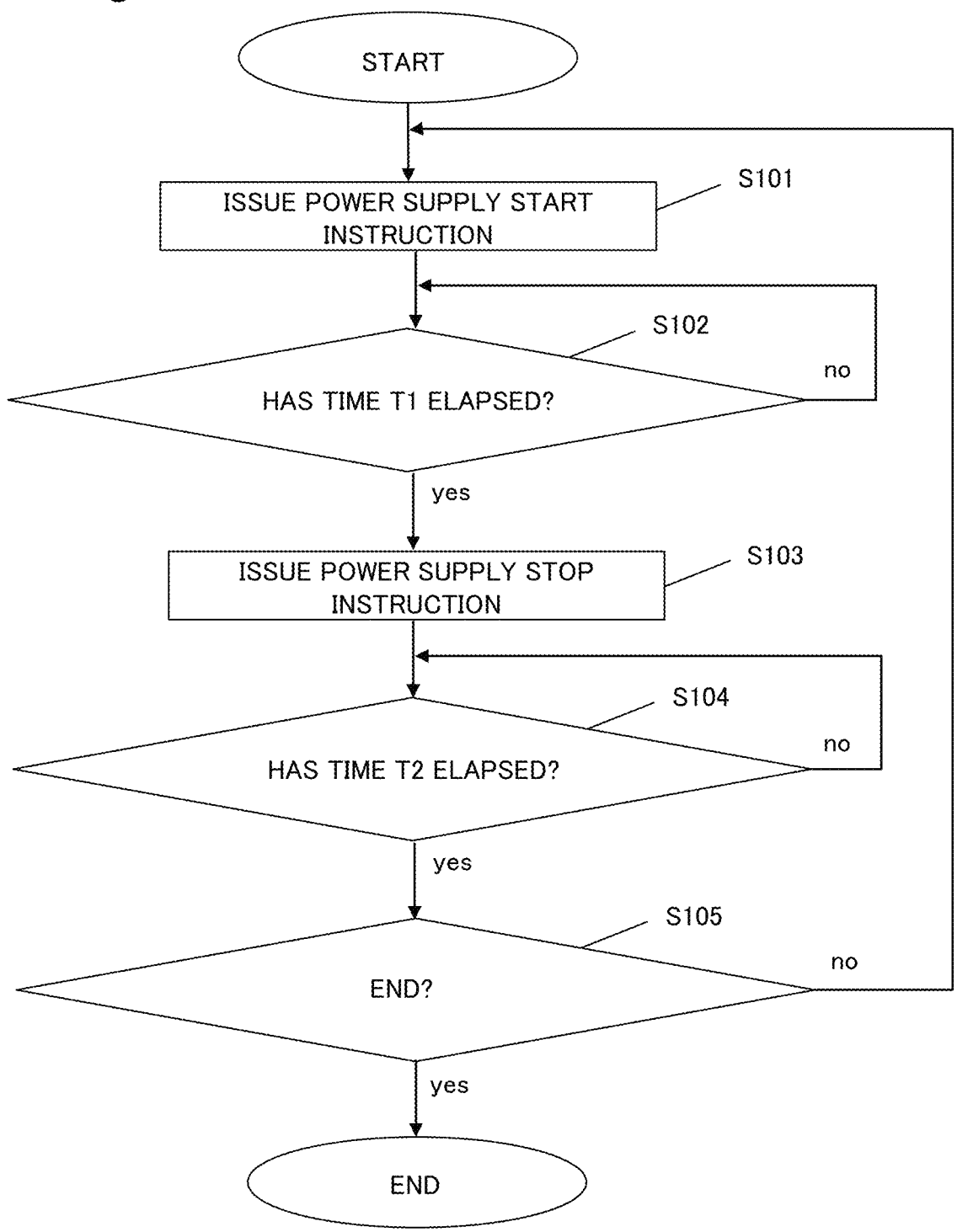
FIG. 7 is a conceptual flowchart illustrating an exemplary sequence of a first process performed by a control unit.
Figure 8:
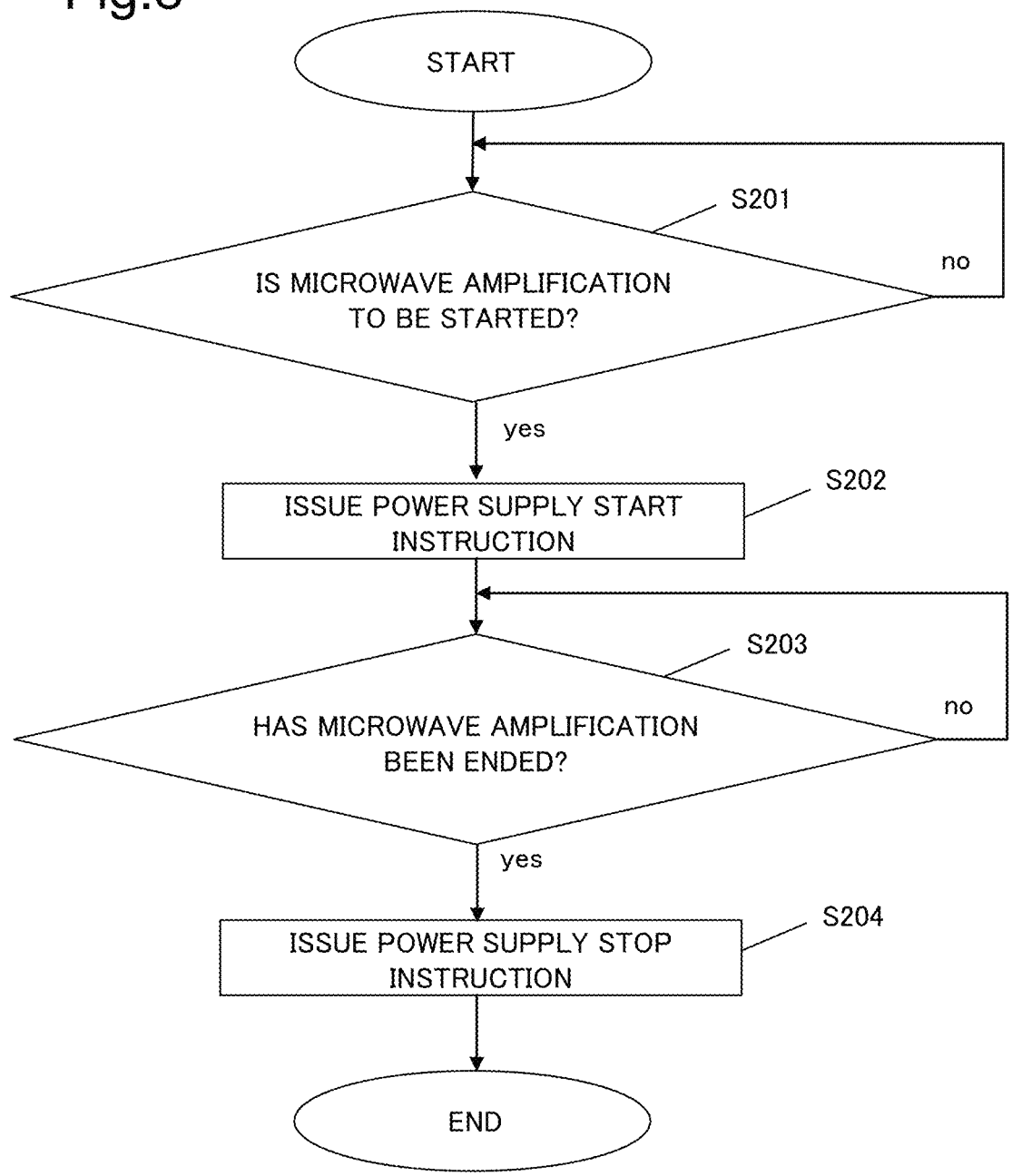
FIG. 8 is a conceptual flowchart illustrating another exemplary sequence of a second process performed by the control unit.
Figure 9:
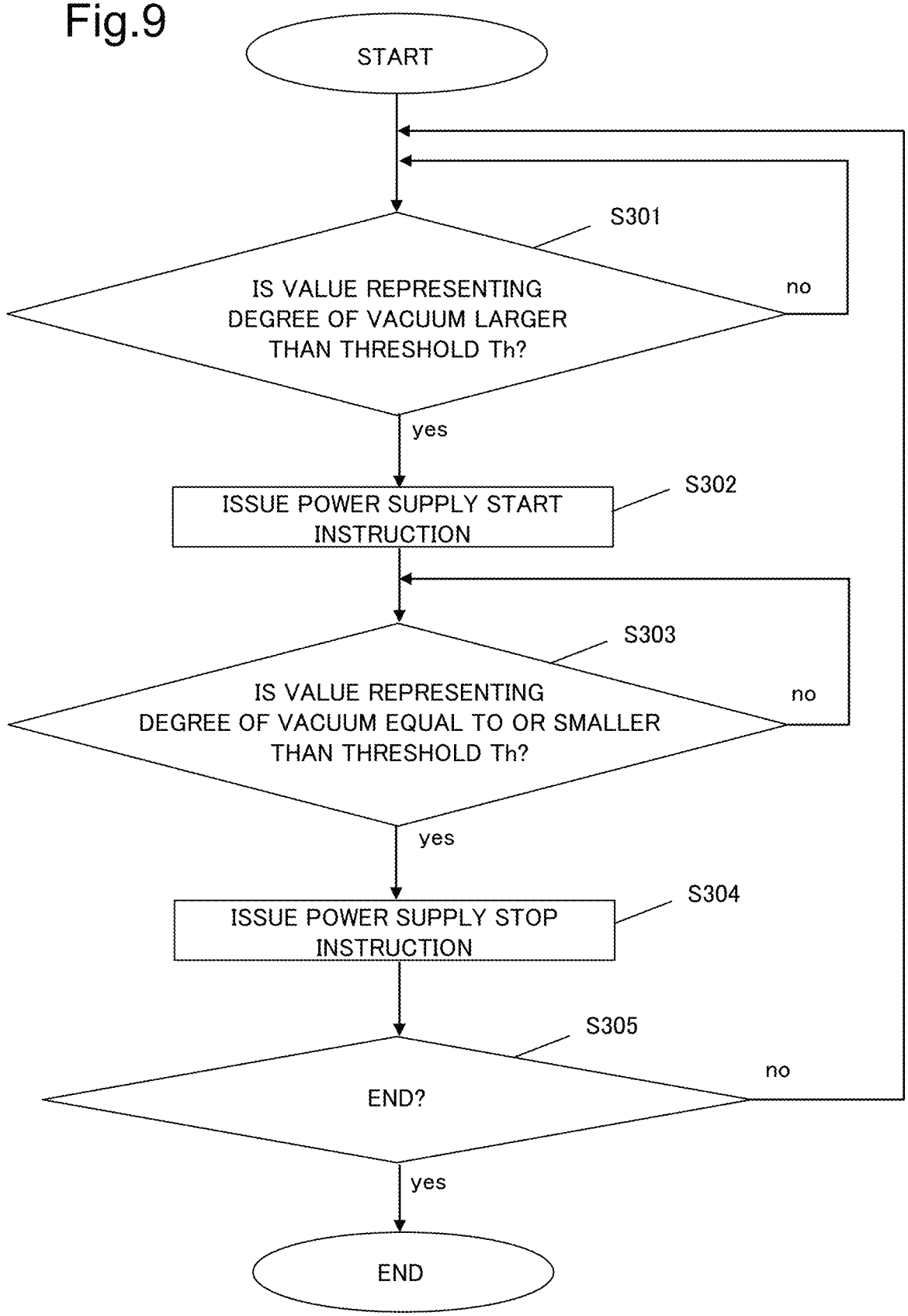
FIG. 9 is a conceptual flowchart illustrating still another exemplary sequence of a third process performed by the control unit.

The control unit 36 illustrated in FIG. 4 performs the process illustrated in any of FIGS. 7 to 9.

FIG. 7 is a conceptual flowchart illustrating an exemplary sequence of a first process performed by the control unit 36 illustrated in FIG. 4. In the exemplary processing sequence illustrated in FIG. 7, the control unit 36 (FIG. 4) causes a power source unit 37 to repeat power supply and stop at a given interval.

The control unit 36 (FIG. 4) starts the processing illustrated in FIG. 7 as, for example, power required to activate the control unit 36 is supplied externally.

As the process in step S101, the control unit 36 (FIG. 4) instructs the power source unit 37 illustrated in FIG. 4 to start power supply across the two terminals of the getter power source 35. In response to the instruction, the power source unit 37 starts power supply across the two terminals of the getter power source 35.

As the process in step S102, the control unit 36 determines whether a time T1 has elapsed from the completion of the process in step S101. Note that the control unit 36 is assumed herein to be permitted to use a timer. In addition, the time T1 is determined in advance for the process in step S102.

When the determination result in the process of step S102 is yes, the control unit 36 performs the process in step S103.

When the determination result in the process of step S102 is no, the control unit 36 performs the process in step S102 again.

In performing the process of step S103, the control unit 36 instructs the power source unit 37 to stop power supply across the two terminals of the getter power source 35, as this process. In response to the instruction, the power source unit 37 stops power supply across the two terminals of the getter power source 35.

The control unit 36 determines whether a time T2 has elapsed from the completion of the process in step S103, as the process in step S104. Note that the time T2 is determined in advance for the process in step S104.

When the determination result in the process of step S104 is yes, the control unit 36 performs the process in step S105.

When the determination result in the process of step S104 is no, the control unit 36 performs the process in step S104 again.

In performing the process of step S105, the control unit 36 determines whether the process illustrated in FIG. 7 is to be ended, as this process. The control unit 36 performs this determination by, for example, determining whether end information has been input externally. The end information is input as, for example, external supply of power required to activate the control unit 36 is stopped.

When the determination result in the process of step S105 is yes, the control unit 36 ends the process illustrated in FIG. 7.

When the determination result in the process of step S105 is no, the control unit 36 performs the process in step S101 again.

FIG. 8 is a conceptual flowchart illustrating another exemplary sequence of a second process performed by the control unit 36 illustrated in FIG. 4. In the exemplary processing sequence illustrated in FIG. 8, the control unit 36 causes the power source unit 37 to supply power and stop power by coordinating with a microwave signal amplification operation by the microwave tube 101 illustrated in FIG. 2.

The control unit 36 starts the process illustrated in FIG. 8 as, for example, power required to activate the control unit 36 is supplied externally.

As the process in step S201, the control unit 36 determines whether a microwave signal amplification operation by the microwave tube 101 illustrated in FIG. 2 is to be started. The control unit 36 performs this determination by, for example, determining whether one of the heater power source 39, the anode power source 30, the collector power source 33, and the helix power source 34 illustrated in FIG. 4 has started voltage supply to a target portion. Note that the control unit 36 is assumed to be notified of one of the above-mentioned power sources, for which the control unit 36 determines whether voltage supply is to be started, when the supply is to be started.

When the determination result in the process of step S201 is yes, the control unit 36 performs the process in step S202.

When the determination result in the process of step S202 is no, the control unit 36 performs the process in step S201 again.

In performing the process of step S202, the control unit 36 instructs the power source unit 37 illustrated in FIG. 4 to start supplying power across the two terminals of the getter power source 35, as this process. In response to the instruction, the power source unit 37 starts power supply across the two terminals of the getter power source 35.

As the process in step S203, the control unit 36 determines whether the microwave signal amplification operation by the microwave tube 101 illustrated in FIG. 2 has ended. The control unit 36 performs this determination by, for example, determining whether one of the heater power source 39, the anode power source 30, the collector power source 33, and the helix power source 34 illustrated in FIG. 4 has ended supplying voltage. Note that the control unit 36 is assumed to be notified of one of the above-mentioned power sources, for which the control unit 36 determines whether supplying voltage has been ended, when the supply has been ended.

When the determination result in the process of step S203 is yes, the control unit 36 performs the process in step S204.

When the determination result in the process of step S203 is no, the control unit 36 performs the process in step S203 again.

In performing the process of step S204, the control unit 36 instructs the power source unit 37 illustrated in FIG. 4 to stop supplying power across the two terminals of the getter power source 35, as this process. In response to the instruction, the power source unit 37 stops power supply across the two terminals of the getter power source 35.

The control unit 36 then ends the processing illustrated in FIG. 8.

FIG. 9 is a conceptual flowchart illustrating still another exemplary sequence of the third process performed by the control unit 36 illustrated in FIG. 4. In the exemplary process sequence illustrated in FIG. 9, the control unit 36 causes the power source unit 37 to perform supplying power and stop supplying upon setting the degree of vacuum in the microwave tube 101 illustrated in FIG. 2.

The control unit 36 starts the process illustrated in FIG. 9 as, for example, power required to activate the control unit 36 is supplied externally.

As the process in step S301, the control unit 36 determines whether the value representing the degree of vacuum in the microwave tube 101 illustrated in FIG. 2 is larger than a threshold Th. Note that the "threshold Th" is defined as a threshold for the value representing the degree of vacuum set in advance for the process in step S301 and the process in step S303 (the latter will be described later). Note also that the larger the value representing the degree of vacuum, the lower the degree of vacuum in the microwave tube 101 is assumed to become.

When the determination result in the process of step S301 is yes, the control unit 36 performs the process in step S302.

When the determination result in the process of step S302 is no, the control unit 36 performs the process in step S301 again.

In performing the process of step S302, the control unit 36 instructs the power source unit 37 illustrated in FIG. 4 to start power supply across the two terminals of the getter power source 35, as this process. In response to the instruction, the power source unit 37 starts supplying power across the two terminals of the getter power source 35.

As the process in step S303, the control unit 36 determines whether the value representing the degree of vacuum is equal to or smaller than the threshold Th.

When the determination result in the process of step S303 is yes, the control unit 36 performs the process in step S304.

When the determination result in the process of step S303 is no, the control unit 36 performs the process in step S303 again.

In performing the process of step S304, the control unit 36 instructs the power source unit 37 illustrated in FIG. 4 to stop supplying power across the two terminals of the getter power source 35, as this process. In response to the instruction, the power source unit 37 stops power supply across the two terminals of the getter power source 35.

As the process in step S305, the control unit 36 determines whether the process illustrated in FIG. 9 is to be ended. The control unit 36 performs this determination by, for example, determining whether end information has been input externally. The end information is input as, for example, external supply of power required to activate the control unit 36 is stopped.

When the determination result in the process of step S305 is yes, the control unit 36 ends the process illustrated in FIG. 9.

When the determination result in the process of step S305 is no, the control unit 36 performs the process in step S301 again.

[Advantageous Effect]

The heater of the getter provided in the microwave tube according to this example embodiment is driven by the getter power source, with one terminal of the heater being connected not to the cathode, but to the ground. With this arrangement, regardless of whether a predetermined cathode voltage has been applied to the cathode to operate the electron gun, or the cathode voltage has not been applied, the heater can be operated by supplying equal voltages to the heater. Therefore, even when the microwave tube is in a microwave signal amplification operation, the degree of vacuum in the microwave tube can be satisfactorily improved by the getter. In other words, the microwave tube according to this example embodiment may satisfactorily perform gas adsorption action of the getter independently of a microwave signal amplification operation.

As described in the [Background Art], furthermore, the microwave tube disclosed in PTL 1 includes a getter incorporated in an electron gun. In contrast, the getter of the microwave tube according to this example embodiment is set at a position closer to the helix, such as the position between the electron gun and the helix, or that between the helix and the collector. Therefore, a more effective adsorption action may be performed especially for a gas released from the helix.

Figure 10:
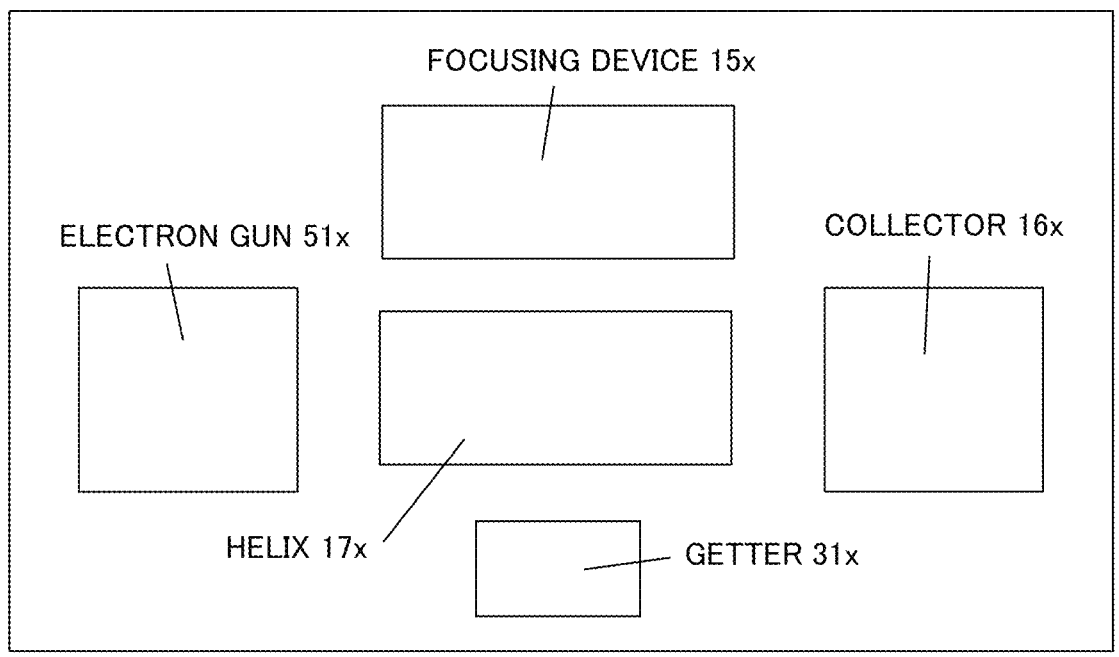
FIG. 10 is a block diagram illustrating the configuration of a minimal microwave tube according to the present invention.

FIG. 10 is a block diagram illustrating the configuration of a microwave signal electron tube 101x as the configuration of a minimal microwave tube according to this example embodiment.

The microwave signal electron tube 101x includes a helix 17x, an electron gun 51x, a focusing device 15x, a collector 16x, and a getter 31x.

The helix 17x may guide a microwave signal to travel from an input section to an output section through a helical tube.

The electron gun 51x emits an electron flow toward the helix 17x.

The focusing device 15x causes the electron flow to traverse the vicinity of the helix 17x in the direction of the collector 16x.

The collector 16x absorbs the electron flow.

The getter 31x includes a heater (not illustrated) insulated from a cathode provided in the electron gun 51x.

To allow the microwave signal electron tube 101x to perform a microwave signal amplification operation, it is necessary to supply a voltage to the cathode (not illustrated) provided in the electron gun 51x. However, the heater is not electrically connected to the cathode. With this arrangement, the getter 31x can perform gas adsorption action by supplying power to the heater even while a predetermined voltage is applied to the electron gun 51x and the cathode. Therefore, the microwave signal electron tube 101x can perform gas adsorption action of the getter even during a microwave signal amplification operation.

With the above-mentioned structure, accordingly, the microwave signal electron tube 101x achieves the effect described in [Advantageous Effects of Invention].

Although each example embodiment of the present invention has been described above, the present invention is not limited to the above-described example embodiments, and further modifications, substitutions, and adjustments can be added without departing from the basic technical concept of the present invention. For example, the arrangements of the components illustrated in each drawing are merely examples to aid in understanding the present invention, and the present invention is not limited to the arrangements illustrated in these drawings.

The whole or part of the example embodiments disclosed above can be described as, but not limited to, the following supplementary notes.

(Supplementary Note 1)

A microwave signal electron tube including:

a helix configured to guide a microwave signal to travel from an input section to an output section through a helical tube;

an electron gun emitting an electron flow toward the helix;

a focusing device causing the electron flow to traverse a vicinity of the helix in a direction to a collector;

the collector absorbing the electron flow; and a getter including a heater insulated from a cathode provided in the electron gun.

(Supplementary Note 2)

The microwave signal electron tube according to supplementary note 1, wherein one terminal of the heater is electrically connected to ground.

(Supplementary Note 3)

The microwave signal electron tube according to supplementary note 1 or 2, wherein the getter is interposed between the focusing device and the collector.

(Supplementary Note 4)

The microwave signal electron tube according to any one of supplementary notes 1 to 3, wherein the getter is interposed between the focusing device and the electron gun.

(Supplementary Note 5)

The microwave signal electron tube according to any one of supplementary notes 1 to 4, wherein the getter is disposed in a vicinity of the helix.

(Supplementary Note 6)

The microwave signal electron tube according to any one of supplementary notes 1 to 5, wherein a plurality of the getters are provided.

(Supplementary Note 7)

The microwave signal electron tube according to any one of supplementary notes 1 to 6, wherein the getter is disposed in an accommodation member that accommodates the getter.

(Supplementary Note 8)

The microwave signal electron tube according to any one of supplementary notes 1 to 7, wherein the heater is driven by a power source driving none of the electron gun, the helix, the focusing device, and the collector.

(Supplementary Note 9)

The microwave signal electron tube according to any one of supplementary notes 1 to 8, wherein the getter performs gas adsorption action during microwave signal amplification.

(Supplementary Note 10)

A getter including a heater insulated from a cathode provided in an electron gun, the getter configured to be mounted in a microwave signal electron tube including:

a helix configured to guide a microwave signal to travel from an input section to an output section through a helical tube;

the electron gun emitting an electron flow toward the helix;

a focusing device causing the electron flow to traverse a vicinity of the helix in a direction to a collector; and the collector absorbing the electron flow.

(Supplementary Note 11)

A microwave signal amplification device including:

the microwave signal electron tube according to any one of supplementary notes 1 to 9; and a power source driving the heater.

(Supplementary Note 12)

The microwave signal amplification device according to supplementary note 11, further including a control unit performing control of a timing at which the power source performs driving of the heater.

(Supplementary Note 13)

The microwave signal amplification device according to supplementary note 12, wherein the control includes performing repetition of the driving and stopping of the driving.

(Supplementary Note 14)

The microwave signal amplification device according to supplementary note 13, wherein the repetition is periodical.

(Supplementary Note 15)

The microwave signal amplification device according to any one of supplementary notes 12 to 14, wherein the control includes starting the driving at the start of microwave signal amplification by the microwave signal electron tube.

(Supplementary Note 16)

The microwave signal amplification device according to supplementary note 15, wherein the driving is started when a determination that the amplification is to be started is performed.

(Supplementary Note 17)

The microwave signal amplification device according to supplementary note 16, wherein the start determination is performed by using a value of one of a voltage and a current supplied to at least one of the electron gun, the helix, the focusing device, and the collector.

(Supplementary Note 18)

The microwave signal amplification device according to any one of supplementary notes 15 to 17, wherein the control includes ending the driving at the end of the amplification.

(Supplementary Note 19)

The microwave signal amplification device according to any one of supplementary notes 12 to 18, wherein the control includes starting the driving with a vacuum value representing a degree of vacuum in one of an inner space of the electron gun, a space surrounding the helix, and an inner space of the collector.

(Supplementary Note 20)

The microwave signal amplification device according to supplementary note 19, wherein the control includes starting the driving when the vacuum value is determined to indicate a degradation in a degree of vacuum.

(Supplementary Note 21)

The microwave signal amplification device according to supplementary note 19 or 20, wherein the control includes ending the driving with the vacuum value.

(Supplementary Note 22)

The microwave signal amplification device according to supplementary note 21, wherein the control includes ending the driving when the vacuum value is determined to indicate an improvement in a degree of vacuum.

(Supplementary Note 23)

The microwave signal amplification device according to any one of supplementary notes 19 to 22, wherein the vacuum value includes an output of a vacuum gauge disposed in the one of an inner space of the electron gun, a space surrounding the helix, and an inner space of the collector.

(Supplementary Note 24)

The microwave signal amplification device according to supplementary note 22, wherein the vacuum value includes a value of a helix current flowing between ground and one of the helix and a conductive portion electrically connected to the helix.

(Supplementary Note 25)

A power source provided for a getter included in a microwave signal electron tube including:

a helix configured to guide a microwave signal to travel from an input section to an output section through a helical tube;

an electron gun emitting an electron flow toward the helix;

a focusing device causing the electron flow to traverse a vicinity of the helix in a direction to a collector; and the collector absorbing the electron flow, the power source including a control unit performing control of a timing to perform driving of a heater insulated from a cathode provided in the electron gun, wherein the control includes starting the driving with start of microwave signal amplification by the microwave signal electron tube.

(Supplementary Note 26)

The power source according to supplementary note 25, wherein the control includes starting the driving when a determination that the amplification is to be started is performed.

(Supplementary Note 27)

The power source according to supplementary note 26, wherein the start determination is performed by using a value of one of a voltage and a current supplied to at least one of the electron gun, the helix, the focusing device, and the collector.

(Supplementary Note 28)

The power source according to any one of supplementary notes 25 to 27, wherein the control includes ending the driving with end of the amplification.

(Supplementary Note 29)

A power source provided in a getter included in a microwave signal electron tube including:

a helix configured to guide a microwave signal to travel from an input section to an output section through a helical tube;

an electron gun emitting an electron flow toward the helix;

a focusing device causing the electron flow to traverse a vicinity of the helix in a direction to a collector; and the collector absorbing the electron flow, the power source including a control unit performing control of a timing to perform driving of a heater insulated from a cathode provided in the electron gun, wherein the control includes starting the driving with a vacuum value representing a degree of vacuum in one of an inner space of the electron gun, a space surrounding the helix, and an inner space of the collector.

(Supplementary Note 30)

The power source according to supplementary note 29, wherein the control includes starting the driving when the vacuum value is determined to indicate a degradation in a degree of vacuum.

(Supplementary Note 31)

The power source according to supplementary note 29 or 30, wherein the control includes ending the driving with the vacuum value.

(Supplementary Note 32)

The power source according to supplementary note 31, wherein the control includes ending the driving when the vacuum value is determined to indicate an improvement in the degree of vacuum.

(Supplementary Note 33)

The power source according to any one of supplementary notes 30 to 32, wherein the vacuum value includes an output of a vacuum gauge disposed in the one of an inner space of the electron gun, a space surrounding the helix, and an inner space of the collector.

(Supplementary Note 34)

The power source according to any one of supplementary notes 29 to 32, wherein the vacuum value includes a value of a helix current flowing between ground and one of the helix and a conductive portion electrically connected to the helix.

While the invention has been particularly shown and described with reference to example embodiments thereof, the invention is not limited to these embodiments. It will be understood by those of ordinary skill in the art that various changes inform and details may be made therein without departing from the spirit and scope of the present invention as defined by the claims.

REFERENCE SIGNS LIST

11, 32, 32a Heater
12 Cathode
13 Wehnelt electrode

14 Anode
15, 15x Focusing device
16, 16x Collector
17, 17x Helix
18a, 18b, 18c, 18d Face
19a, 19b, 19c, 28a, 28b Insulator
27 Getter chamber
26 Conductor member
30 Anode power source
31 Getter
33 Collector power source
34 Helix power source
35 Getter power source
37 Power source unit
36 Control unit
38a, 38b Wire
39 Heater power source
48 Upper portion
51, 51x Electron gun
52 Electron emitting surface
53 Opening portion
61 Input section
62 Output section
100 Microwave signal amplification device
101, 101a, 101b, 901 Microwave tube
101x Microwave signal electron tube
131, 931 Power source
A, B, C, Ca, D, Da, E, F, G, H, I, J, K, L, M, N Terminal

The invention claimed is:

1. A power source provided for a getter included in a microwave electron tube including:
   a helix configured to guide a microwave signal to travel from an input section to an output section through a helical tube;
   an electron gun emitting an electron flow toward the helix;
   a focusing device causing the electron flow to traverse a vicinity of the helix in a direction to a collector; and
   the collector absorbing the electron flow,
   the power source including a control unit performing control of a timing to perform driving of a heater insulated from a cathode provided in the electron gun, wherein
   the control of the timing includes starting the driving by a start of microwave signal amplification by the microwave electron tube.

2. A power source provided for a getter included in a microwave electron tube including:
   a helix configured to guide a microwave signal to travel from an input section to an output section through a helical tube;
   an electron gun emitting an electron flow toward the helix;
   a focusing device causing the electron flow to traverse a vicinity of the helix in a direction to a collector; and
   the collector absorbing the electron flow,
   the power source including a control unit performing control of a timing to perform driving of a heater insulated from a cathode provided in the electron gun, wherein
   the control of the timing includes starting the driving by a vacuum value representing a degree of vacuum in one of an inner space of the electron gun, a space surrounding the helix, and an inner space of the collector.

3. A microwave electron tube including:
   a helix configured to guide a microwave signal to travel from an input section to an output section through a helical tube;
   an electron gun emitting an electron flow toward the helix;
   a focusing device causing the electron flow to traverse a vicinity of the helix in a direction to a collector;
   the collector absorbing the electron flow; and
   a getter including a heater insulated from a cathode provided in the electron gun, wherein the getter is interposed between the focusing device and the collector.

4. A microwave signal amplification device including:
   the microwave electron tube according to claim 3; and
   a power source driving the heater.

5. The microwave electron tube according to claim 3, wherein the getter is disposed in a vicinity of the helix.

6. The microwave electron tube according to claim 3, wherein one or more additional getters are provided.

7. The microwave electron tube according to claim 3, wherein the getter is disposed in an accommodation member that accommodates the getter.

8. The microwave electron tube according to claim 3, wherein the heater is driven by a power source driving none of the electron gun, the helix, the focusing device, and the collector.

9. The microwave electron tube according to claim 3, wherein the getter performs a gas adsorption action when the microwave signal is amplified.

10. A microwave signal amplification device including:
    a microwave electron tube; and
    a power source driving a heater,
    wherein the microwave electron tube includes,
    a helix configured to guide a microwave signal to travel from an input section to an output section through a helical tube;
    an electron gun emitting an electron flow toward the helix;
    a focusing device causing the electron flow to traverse a vicinity of the helix in a direction to a collector;
    the collector absorbing the electron flow
    a getter including the heater insulated from a cathode provided in the electron gun; and
    control unit performing control of a timing at which the power source performs driving of the heater.

11. The microwave signal amplification device according to claim 10, wherein the control of the timing includes starting the driving with a start of microwave signal amplification by the microwave electron tube.

12. The microwave signal amplification device according to claim 10, wherein the control of the timing includes starting the driving with a vacuum value representing a degree of vacuum in one of an inner space of the electron gun, a space surrounding the helix, and an inner space of the collector.

13. The microwave signal amplification device according to claim 12,
    wherein the control includes ending the driving with the vacuum value
    representing the degree of vacuum and
    wherein the vacuum value includes a value of a helix current flowing between ground and one of the helix and a conductive portion electrically connected to the helix.

* * * * *